United States Patent
Liang et al.

(10) Patent No.: US 7,056,767 B2
(45) Date of Patent: Jun. 6, 2006

(54) METHOD AND APPARATUS FOR FLIP CHIP DEVICE ASSEMBLY BY RADIANT HEATING

(75) Inventors: Jimmy Liang, Taipei (TW); Kevin Jin, Hsin-Tien (TW); T. T. Chiu, Tu Cheng (TW)

(73) Assignee: Texas Instruments Incorporated, Dallas, TX (US)

(*) Notice: Subject to any disclaimer, the term of this patent is extended or adjusted under 35 U.S.C. 154(b) by 71 days.

(21) Appl. No.: 10/725,726

(22) Filed: Dec. 2, 2003

(65) Prior Publication Data
US 2004/0108600 A1 Jun. 10, 2004

Related U.S. Application Data

(62) Division of application No. 10/032,907, filed on Dec. 28, 2001, now abandoned.

(51) Int. Cl.
*H01L 21/44* (2006.01)
*H01L 21/48* (2006.01)
*H01L 21/50* (2006.01)
*B23K 31/00* (2006.01)
*B23K 31/02* (2006.01)

(52) U.S. Cl. .............. 438/108; 438/111; 438/112; 438/118; 438/613; 228/180.22

(58) Field of Classification Search .............. None
See application file for complete search history.

(56) References Cited

U.S. PATENT DOCUMENTS

| | | | |
|---|---|---|---|
| 4,645,116 A * | 2/1987 | Henein et al. ............ 228/123.1 |
| 5,060,288 A * | 10/1991 | Spigarelli et al. ........... 392/412 |
| 5,261,593 A * | 11/1993 | Casson et al. ........... 228/180.22 |
| 5,438,165 A * | 8/1995 | Fritz ............................ 174/256 |
| 5,438,749 A * | 8/1995 | Runyon ......................... 29/825 |
| 5,482,200 A * | 1/1996 | Myers et al. ................ 228/191 |
| 5,641,997 A * | 6/1997 | Ohta et al. ................... 257/788 |
| 5,861,678 A * | 1/1999 | Schrock ....................... 257/783 |
| 6,046,076 A * | 4/2000 | Mitchell et al. ............. 438/127 |
| 6,063,139 A * | 5/2000 | Fukaya ....................... 29/25.01 |
| 6,126,428 A * | 10/2000 | Mitchell et al. ............. 425/110 |
| 6,200,830 B1 * | 3/2001 | Ito et al. ..................... 438/106 |
| 6,221,691 B1 * | 4/2001 | Schrock ....................... 438/106 |
| 6,235,555 B1 * | 5/2001 | Cho ............................ 438/112 |
| 6,395,124 B1 * | 5/2002 | Oxman et al. ........... 156/275.5 |
| 6,485,301 B1 * | 11/2002 | Gemunder et al. ........... 433/29 |
| 6,555,414 B1 * | 4/2003 | Vanfleteren et al. ......... 438/108 |
| 6,692,611 B1 * | 2/2004 | Oxman et al. ........... 156/275.5 |
| 6,858,469 B1 * | 2/2005 | Schrock ....................... 438/111 |
| 6,914,196 B1 * | 7/2005 | Cho ............................ 174/254 |
| 2002/0027294 A1 | 3/2002 | Neuhaus et al. |
| 2002/0079594 A1 | 6/2002 | Sakurai |
| 2003/0097748 A1 * | 5/2003 | How et al. ..................... 29/739 |

* cited by examiner

*Primary Examiner*—David E. Graybill
(74) *Attorney, Agent, or Firm*—J. Dennis Moore; W. James Brady, III; Frederick J. Telecky, Jr.

(57) ABSTRACT

A flip chip semiconductor device having non-solder contact terminals is assembled by securing the chip and substrate with a rapidly thermosetting adhesive. The process is amenable to various bump and substrate materials, and has the advantage of simultaneously adhering the components and of providing a void free underfill. The process makes use of absorption of infrared energy by the chip to heat the adhesive and cause it to flow prior to rapidly solidifying from the center outwardly. The rapid assembly, using a simple infrared exposure apparatus is compatible with reel to reel, or other highly automated in-line processes.

3 Claims, 4 Drawing Sheets

METHOD AND APPARATUS FOR FLIP CHIP DEVICE ASSEMBLY BY RADIANT HEATING

This is a Divisional of application Ser. No. 10/032,907, filed Dec. 28, 2001, now abandoned.

FIELD OF THE INVENTION

This invention relates to a method of assembling flip chip circuits, and more particularly to a method of curing a joining and underfill adhesive.

BRIEF DESCRIPTION OF PRIOR ART

Increasing circuit element density in integrated circuits, and the requisite number of input/output terminals (I/O's) has caused the industry to move away from traditional peripheral wire bonding between the chip and its substrate to interconnection schemes capable of supporting greater densities of I/Os, such as flip chip bonding methods. Flip chip assembly accommodates a higher I/O density because it is feasible to populate the entire surface of the chip with I/O connections.

In the flip chip process, a two dimensional array of terminals are provided on the active surface of a semiconductor device, typically an integrated circuit chip, and a mirror image array of terminals are provided on one surface of the mounting substrate. Typically the chip terminals comprise solder, the substrate terminals a solder wettable metal, and the terminals are joined by heating to a temperature sufficient to reflow of the solder. It has been shown that stress on the solder joints from thermal mismatch, and/or fatigue by cycling and activation of the circuits is alleviated by reinforcement using a resin deposited between the chip and substrate; the material is referred to as "underfill". This use of an underfill having optimized mechanical properties has allowed a significant improvement in reliability of flip chip assembled devices.

An alternate flip chip assembly which does not rely on solder joints makes use of an anisotropic conductive adhesive for joining the chip and substrate. Usually anisotropic adhesives include electrically conductive metallic particles, having the concentration controlled such that conduction is in one direction only. The particles are suspended in an insulating matrix so that the adhesive is electrically insulating in the transverse direction. In flip chip applications, conductive particles are trapped between the protruding contacts of the chip and the terminals of the substrate, pressure is applied to allow conduction, and the resin is cured by thermal or photonic energy.

Photonic energy from ultraviolet (UV) radiation has been used in the assembly of some flip chip devices which include glass or other UV transparent substrates. However, these applications are obviously limited. In other examples, laser excitation has been used to penetrate selected substrate materials, and either to reflow solder bumps on conventional flip chip, or to locally heat the anisotropic adhesive. In such case, both the substrate and material selection are severely constrained, and the process must be very carefully controlled to avoid damage.

Flip chip bonding by anisotropic electrically conductive adhesives does offer some attractive advantages; among those advantages are, that the compound may be used to completely encase the bumps and area between substrate and chip, thus serving both as the underfill polymer, as well as the conducting medium. Further, with anisotropic adhesive flip chip bonding, a variety of bump metallurgy and manufacturing techniques may be selected.

Yet another related flip chip assembly method is TAB bonding wherein bumps on a semiconductor chip are bonded to terminals on a flexible tape. Typically, the assembly includes individually thermal compression bonding each gold bump to a gold pad or lead. The device may subsequently be handled in either face up or face down configuration. This technology has been particularly limited by high costs, poor automation and assembly speed, and further, is more amenable to perimeter bonding than to area array.

With the above mentioned flip chip technologies, a number of issues are unresolved. The industry would like to have a means of assembly which is compatible with automated in-line processing, and is compatible with different types of substrates and bump technologies, and to have an underfill process which supports reliable contacts and high yield.

SUMMARY OF THE INVENTION

It is an object of the invention to provide a reliable semiconductor device having flip chip interconnections to a substrate with contacts which mirror those on the chip, and an underfill polymer between the chip and substrate which further provides mechanical support to the assembly.

It is an object of the invention to provide a rapid and economical process, compatible with automated in-line assembly, as required for high volume production.

It is an object of the invention that the assemblage be compatible with a number of different substrate materials.

It is an object of the invention to provide a new and useful technique for curing the underfill/attach adhesive, and that the curing technique be largely insensitive to the type of substrate.

It is an object of the invention to provide a method of curing the adhesive which minimizes voids in the attach and underfill polymer, thereby supporting high yield and reliability of the assembled devices.

It is an object of the invention to provide an assembly method which is compatible with different types of bump technologies.

It is an object of the invention to provide a method of heating selected components of the assemblage so that outgassing products of the adhesive are expelled, and do not lead to void formation.

It is an object of the invention to provide an optical process in the fabrication of flip chip devices, which in turn eliminates damage resulting from contact during adhesive curing.

It is an object of the invention to provide a rudimentary equipment design for high speed cure of a flip chip attach polymers.

It is an object of the invention that the adhesive may be either a non-conductive, or an anisotropically conductive material.

These and other objectives are met by aligning the active surface of a semiconductor device having an array of protruding conductive contacts to matching contact pads on a substrate, onto which an adhesive paste has been deposited. Conductive terminals of the chip and substrate are brought into intimate contact, and simultaneously bonded by thermal or ultrasonic energy. A programmable infrared (IR) source is directed onto the backside of the chip, and the radiant energy absorbed by the chip is rapidly transferred as heat through the chip and the attached conductive bumps. As heat is transferred through the thermally conductive bumps. The viscosity of the adhesive paste at first decreases, allowing it to flow and fill the area surrounding the bumps, and to fill the space between chip and substrate. This change is followed by a rapid increase in viscosity, or gelation, wherein the polymer solidifies, and adheres the substrate to the chip surface. The solidified or partially cured polymer provides mechanical reinforcement to the contacts, thus allowing electrical and mechanical continuity to be maintained during subsequent handling or use.

During the initial IR exposure, heat radiating from the chip and bumps allows the paste to cure first from the center, and dispel vapors emitted during the curing process from the edges surrounding the chip, and to be removed by an exhaust system. The assemblage may then transfer to a conventional thermal oven to complete cross linking and stress relaxation between the substrate and chip.

Because infrared absorption and heat transfer to cure the adhesive takes place preferentially from the chip, with transfer to conductive bumps, the substrate is not limited to a material having specific transmission characteristics, but instead the process is applicable to a wide range of substrates.

A low modulus adhesive serving as an underfill material, having few or no voids as a result of the heat flow pattern, minimizes stress on the chip, substrate, and connecting bumps.

A simple infrared illumination system including a lamp, condenser, and mirror with a vacuum exhaust is suitable for gelling the adhesive within about two seconds, thereby providing a rapid and inexpensive manufacturing solution for simultaneously adhering and underfilling a flip chip device. The process is controlled by a computer program with respect to exposure, and is specific for a given device. Further, it is amenable to continuous manufacturing schemes, such as reel to reel assembly of flex film devices.

The process for adhesive curing based on radiant heating provides a rapid, defect free environment which imparts no mechanical damage to the semiconductor chip.

DETAILED DESCRIPTION OF THE DRAWINGS

Figures 1A, 1B, 1C:
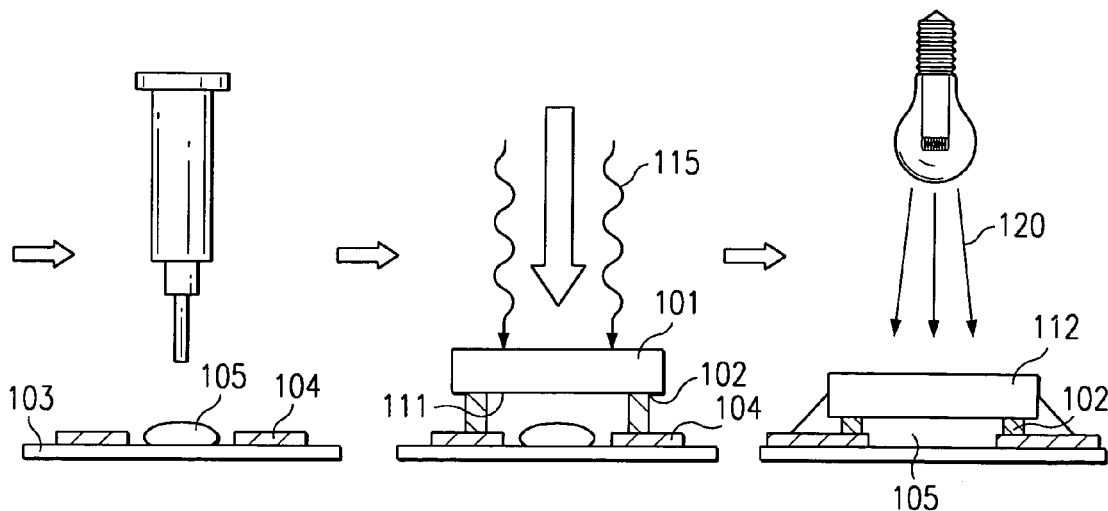
FIG. 1a shows as adhesive dispensed onto a substrate.
FIG. 1b is the process step whereby a flip chip is aligned and bonded to the substrate.
FIG. 1c illustrates IR exposure to heat the chip, and cure the adhesive according to the current invention.

In FIG. 1a, a predetermined amount of a thermosetting adhesive paste 105 is dispensed onto a dielectric substrate 103 having an array of metallic contact pads 104. In FIG. 1b, a semiconductor chip 101 having an array of protruding contact terminals 102 on the active or first surface 111 is aligned to contact pads 104 the substrate, and is brought into intimate contact. Thermal or ultrasonic energy represented as arrows 115 is applied to simultaneously bond all contacts, thereby allowing electrical continuity between the chip conductive terminals 102 and substrate contact pads 104.

In FIG. 1c, the backside of the chip 112 is exposed to infrared radiation 120, the energy is preferentially absorbed by the chip, and in turn, the resulting heat is transferred first into the conductive bumps 102, and then into the adhesive 105.

Figure 2:
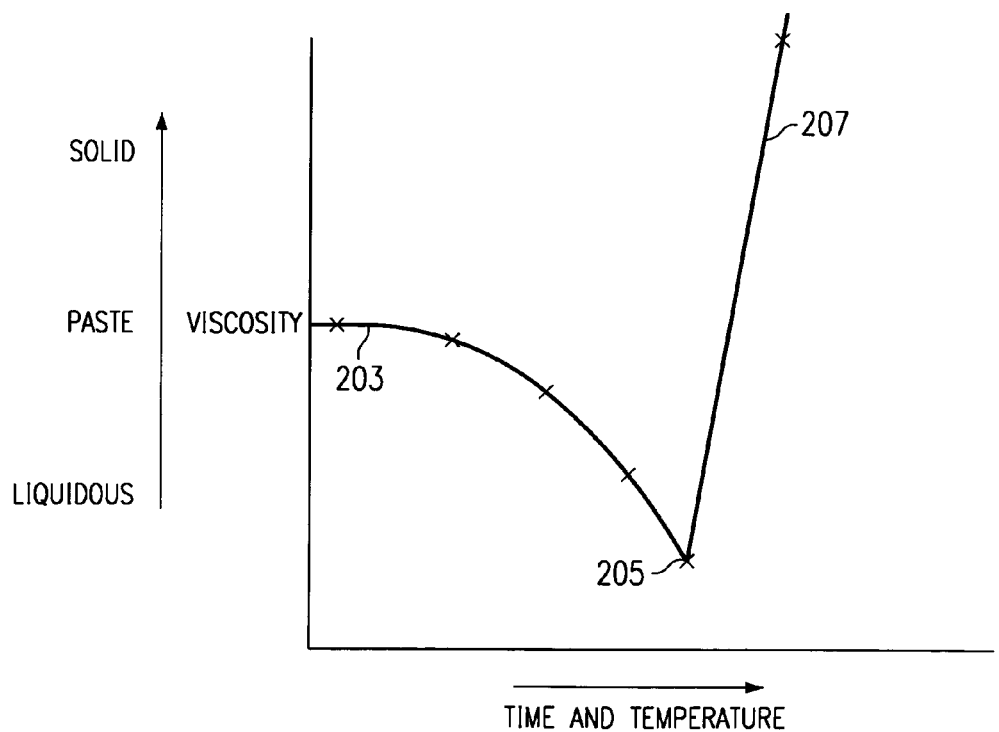
FIG. 2 is an example of a viscosity curve for a thermosetting adhesive. (Prior Art)

With exposure to heat, viscosity of the thermosetting adhesive paste initially decreases so that it becomes sufficiently liquid to flow around the bumps 102, and fill the space between chip surface 111 and substrate 103. Very rapidly, viscosity of the adhesive increases to the point of gelling or solidifying the polymer. An example of the viscosity changes which a thermosetting polymer undergoes with time during thermal exposure is given in FIG. 2; the viscosity of the paste 203 decreases until it reaches a gel point 205, at which it rapidly increases to form a solid 207. In the flip chip assembly of the current invention, the solidified and partially cured polymer adheres the chip to substrate, and provides mechanical support for the assemblage.

Figure 3A:
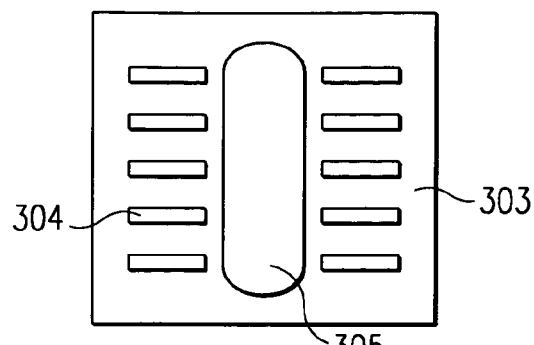
FIG. 3a is a top view of the adhesive on the substrate.
Figure 3B:
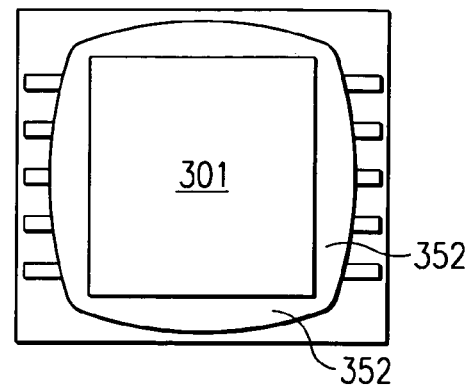
FIG. 3b illustrates the adhesive location following chip placement, adhesive flow and cure.

FIG. 3a is a top view showing the position of the adhesive 305 as dispensed in paste form onto the substrate 303. FIG. 3b illustrates how the adhesive 305 has spread completely under the chip 301, and is extruded to form a fillet 352 surrounding the chip following IR radiant exposure. It can be noted in FIG. 3a that the controlled amount of adhesive does not spread onto the contact pads 304, but instead is mounded in an unpatterned area of the substrate.

The protruding chip contacts are preferably gold bumps formed by plating or wire bonding onto the chip input/output (I/O) pads. However, many other types of bumps, such as those comprising copper or metal coated spheres are acceptable flip chip contacts.

Suitable substrate materials include polymeric films, such as Kapton or Upilex, laminate polymers such as FR-5, composite polymers, quartz, glass, or ceramic. Substrate contact pads are the terminus of a conductor trace which preferably include patterned copper covered by a nickel and gold flash. Other conductors patterned on a dielectric substrate are acceptable. In the preferred embodiment, the substrate is a thermally stable flexible film of the polyimide family having a top layer of gold on the contact pads.

In the preferred embodiment, device contacts are thermocompression bonded simultaneously by a brief exposure of thermal energy in the range of 260 to 325 deg. C. The gold to gold bonded contacts provide a conductive path between chip and substrate. The near instantaneous metal bonding affixes the chip and substrate contact terminals so that contamination of the electrically conductive surfaces by resin or oxidation is prevented.

Reliable flip chip assemblies do not require formation of inter-metallics in the bonds between contacts of the chip and substrate, so long as the contacts maintain intimate, ohmic contact. Once the bonding is completed, contact is maintained by surrounding the terminals and interfaces with a structural support medium. A non-conductive or an anisotropic polymer adhering the substrate to the chip acts as a mechanical support to the contact union. In a preferred embodiment, a non-conductive polymeric material having both a relatively low modulus of elasticity and coefficient of thermal expansion serves both as an adhesive to join the major components, and as an underfill material to support subsequent thermal processing.

Very rapid assembly of a flip chip device of this invention, and particularly in-line processing requires that the adhesive have an extremely short gel time. An example of a suitable adhesive is available from Toshiba Chemical Company under the part name of TNP0100. While the energy transfer mechanism, and the paste rhelogical behavior have been described in a step-wise manner, it should be recognized that the thermal reactions occur within the range of one to five seconds for the flip chip application.

Figure 4:
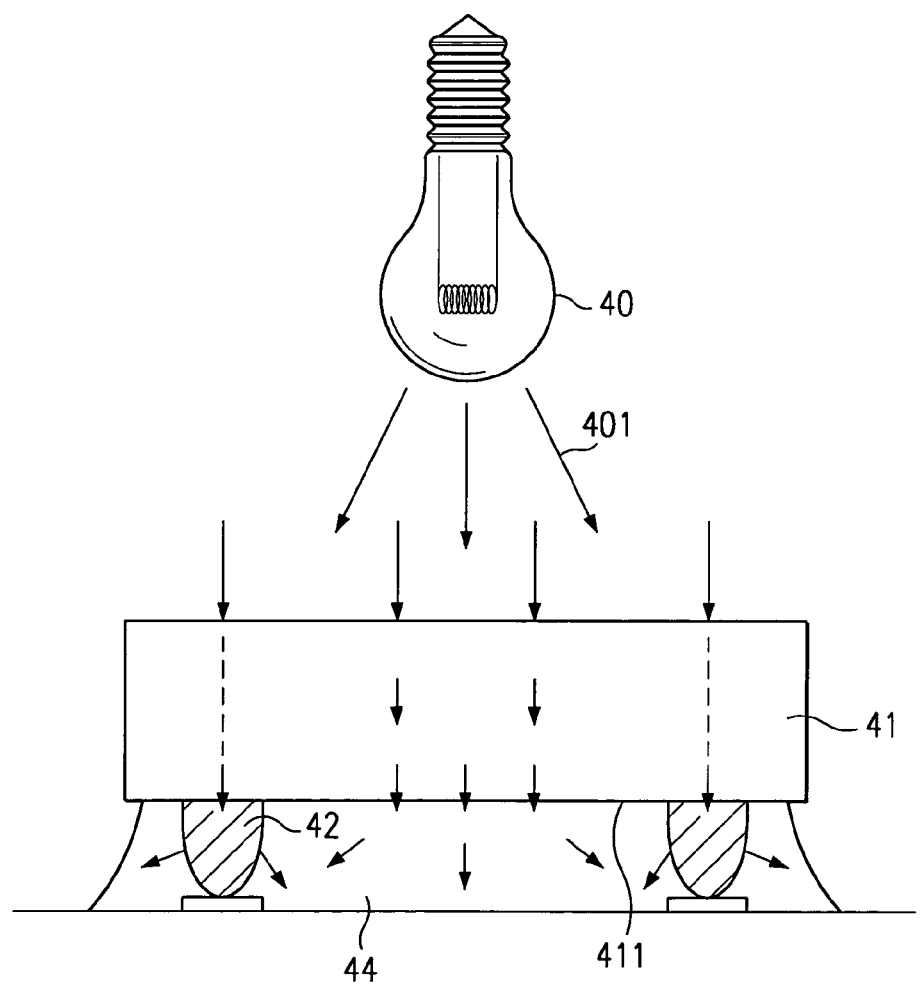
FIG. 4 illustrates the heat flow path of the current invention.

Key to the development of the rapid and reliable flip chip assembly process is the method for applying heat, so that adhesive flow, gelation, and void formation are controlled in a desirable manner. An infrared radiation source focused on the back of the silicon chip provides a selective means of heating the assembly, and allowing gases from the polymer to be expelled within about two seconds. In FIG. 4, arrows illustrate the heat flow path of the current invention, wherein radiant energy 401 from an infrared lamp 40 is absorbed by the silicon chip 41, and is rapidly conducted through the chip and into the conductive bumps 42 on the active surface 411 of the chip. The metallic bumps are highly conductive, both electrically and thermally. Heat, radiating both from the bumps 42 and the active surface 411 of the chip initiate viscosity changes in the polymer 44, as exemplified in FIG. 2. Initially, the polymer flows and fills the area surrounding the bumps and under the chip, and at the gel point, it rapidly solidifies. Because the heat flow path proceeds from the chip surface 411 and bumps 42, the polymeric changes initiate at those interfaces and proceed toward the cooler perimeter of the device. Further, as gelling and onset of cure progress from the chip center and surface, and from the area surrounding the bumps, any gaseous products of cure are expelled at the edge of the chip, and are carried away by an exhaust system.

In the fabrication of flip chip semiconductor devices, it is desirable that attachment of the chip to a substrate imparts only a minimal stress on components, and particularly on the conductive joints and interfaces of the assemblage. The IR radiation method of the current invention, using heat conducted through the chip and bumps from the chip center progressing outwardly provides a method for void free adhesive cure. Eliminating voids or other discontinuities in the adhesive which may act as stress concentration sites has a positive impact on yield and reliability of the device.

A further advantage of the radiant optical heating method for curing the adhesive lies in the lack of contact required to hold components of the assemblage in place during processing. Components of the assembly are not constrained during the thermal excursions, and are free to expand and contract without applied mechanical stress.

Figure 5:
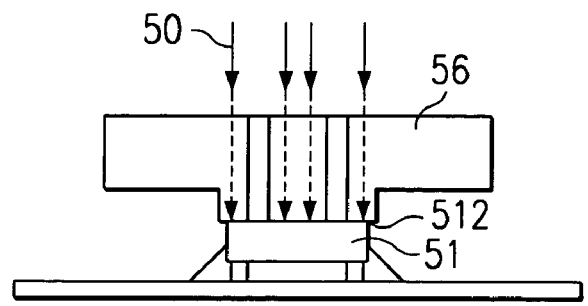
FIG. 5 demonstrates the IR illumination path.

FIG. 5 illustrates the path of infrared illumination, as the beam 50 travels through a simple quartz lens 56 wherein the perimeter is greater than that of the chip, and onto the back surface 512 of the flip chip 51.

Figure 6:
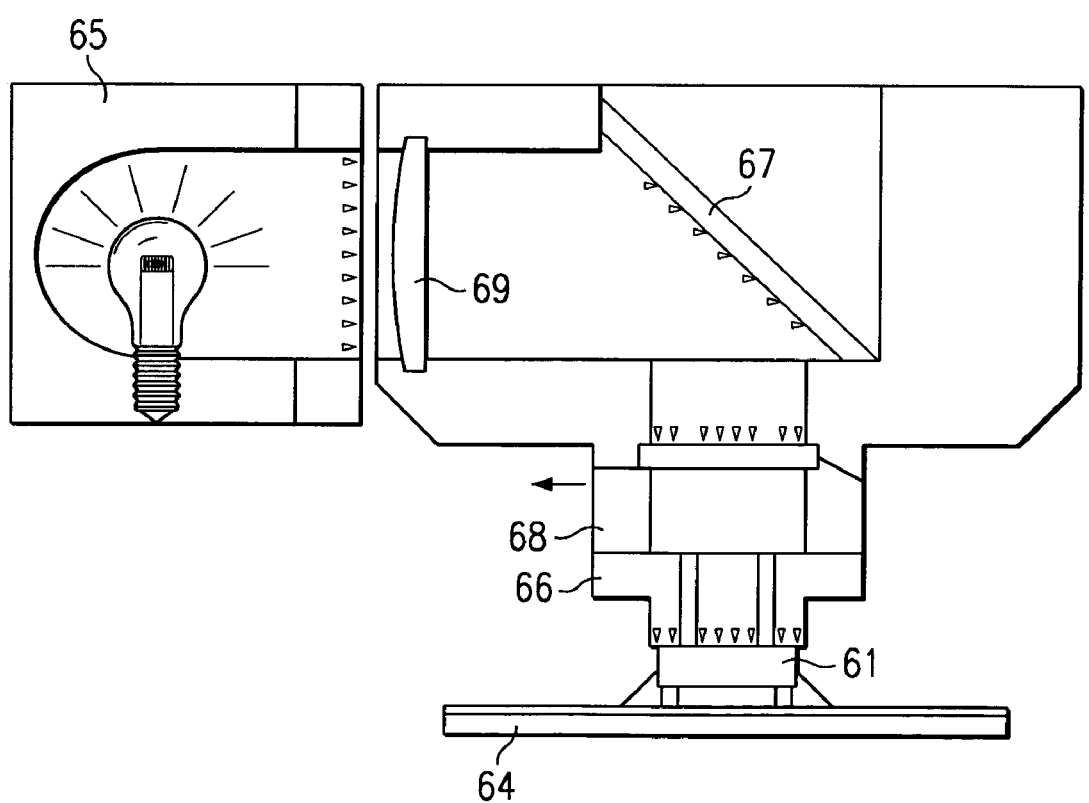
FIG. 6 is a schematic representation of the IR illumination equipment

FIG. 6 illustrates a rudimentary infrared exposure apparatus which is well suited for heating a flip chip device and curing a polymeric adhesive used to secure the assemblage. Radiation from an IR lamp source 65 is reflected off a mirror 67 positioned at approximately a 45 degree angle from the lamp, and is directed through a quartz lens 66 onto the silicon chip 61. Preferably the infrared source emits radiation in the 0.5 to 2.0 micron range. Ramp time, duration, and intensity of the exposure are controlled by computer inputs which are specific to the device properties. Device properties of interest include chip area, reflectivity, and number of contacts.

Outgassing products from the adhesive are removed by a vacuum exhaust 68 system. The lamp 65 and a condenser assembly 69 are preferably positioned to the side of the assembly line, with only the lens 66 and mirror 67 directly above the work surface 64. This configuration is ideally suited for in-line processing wherein the flip chip assemblage is bonded prior to being indexed under the IR beam. However, many variations on the equipment configuration are readily envisioned. In an alternate configuration, the IR source will be placed directly over the work station, and one or more flip chip devices positioned under the lamp.

Figure 7:
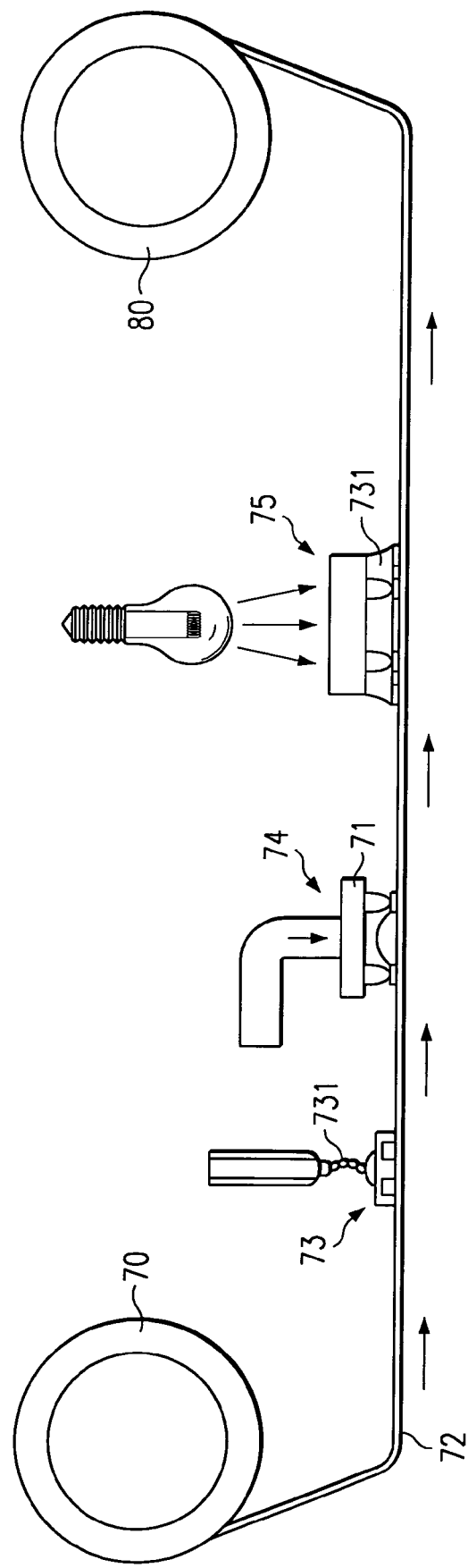
FIG. 7 illustrates the in-line process flow of a preferred reel to reel assembly embodiment.

The flip chip assembly using radiant heating advantageously is a reel to reel process as illustrated in FIG. 7. From a reel 70, a patterned flexible film substrate 72 is indexed to a paste dispense work station 73 where a thermosetting adhesive paste 731 is deposited onto the center of the each device substrate 72. At the next in-line position 74, a bumped chip 71 is aligned to substrate contact pads and is thermal compression bonded within a matter of seconds. The assemblage is indexed to the IR cure station 75 where the adhesive 731 is gelled and at least partially cured, prior to moving to the take-up reel 80. The reel loaded with assembled devices may then be taken to an off-line convection cure system for completing cross-linking and stress relief of the assembled devices in reel format.

A key advantage of the current invention is that the adhesive curing process takes place in equal to or less time than the alignment and bonding process, so that the automated assembly is not slowed by the curing process.

Although a particular preferred embodiment of the device, process, and equipment have been shown and described, many modifications and improvements will be envisioned by those familiar with the flip chip assembly process, and the automation necessary for high volume production of an adhesive supported device. It should be understood, therefore, that the invention is not limited to a particular form, and is intended that the appended claims cover all modifications that do not depart from the spirit and scope of the invention.

What is claimed is:

1. A reel to reel method for assembling a plurality of flip chip semiconductor devices including the following steps:

feeding flexible tape, having a sequence of substrates disposed thereon, each such substrate having arranged on a contact surface thereof a pattern of conductor traces terminating in contact pads, stepwise from a reel onto a work station; depositing a rapidly curing thermosetting adhesive on an unpatterned area of one of said substrates, feeding the tape to move the one of said substrates to a next work station; aligning a semiconductor chip having a back surface and having contact terminals protruding from a front surface thereof, such that the contact terminals align with mating contact pads on said substrate; and bonding the contact terminals with the contact pads by thermal compression bonding;

feeding the tape to move the one of said substrates to a further work station having an infrared radiation source; exposing the back surface of said chip to said infrared radiation for a duration whereby the infrared radiation is conducted as heat to said adhesive and causes said adhesive to flow between the contact surface of the substrate and the front surface of the chip, surrounding the contact terminals, and subsequently solidify to adhere the chip to the substrate to form the assembled device; and winding the tape with the assembled device onto a take up reel.

2. A method as in claim 1 wherein the duration of infrared exposure is less than a time for alignment and bonding of the chip and the substrate.

3. A method as in claim 1 wherein the terminals are bonded by thermo-sonic bonding.

* * * * *